(12) United States Patent
Kai (10) Patent No.: US 6,250,852 B1
(45) Date of Patent: Jun. 26, 2001

(54) SPHERICAL OBJECT SUPPLYING APPARATUS

(75) Inventor: Shuho Kai, Fukuoka (JP)

(73) Assignee: Mitsui High-Tec, Inc., Fukuoka (JP)

( * ) Notice: Subject to any disclaimer, the term of this patent is extended or adjusted under 35 U.S.C. 154(b) by 0 days.

(21) Appl. No.: 09/110,660

(22) Filed: Jul. 7, 1998

(30) Foreign Application Priority Data

Aug. 20, 1997 (JP) .................................................. 9-224116

(51) Int. Cl.$^7$ .................................................. B65G 53/38
(52) U.S. Cl. ........................ 406/137; 406/46; 406/144; 406/153
(58) Field of Search .................. 406/46, 122, 137, 406/141, 144, 153, 143

(56) References Cited

U.S. PATENT DOCUMENTS

| | | | |
|---|---|---|---|
| 1,423,536 | * 7/1922 | Moser | 406/137 |
| 2,120,003 | * 6/1938 | Schanz | 406/144 |
| 2,688,423 | * 9/1954 | Davis | 406/137 |
| 5,570,812 | * 11/1996 | Ando et al. | 406/137 |
| 5,853,108 | * 12/1998 | Ando et al. | 406/137 |

\* cited by examiner

Primary Examiner—Christopher P. Ellis
Assistant Examiner—Joe Dillon, Jr.
(74) Attorney, Agent, or Firm—Greenblum & Bernstein, P.L.C.

(57) ABSTRACT

A spherical object supplying apparatus is to positively and smoothly supply, when spherical objects such as spherical single crystal silicons are supplied from a storing container such as a hopper to the following processing or manufacturing station (or apparatus), the spherical objects one at a time. The apparatus comprises: a supplying pipe path coupled to a spherical object storing container; a branch pipe which branches from the supplying pipe path; and a fluid supplying apparatus adapted to introduce pressurized fluid into the branch pipe path. The spherical objects are accelerated by the pressurized fluid which is jetted through the branch pipe path into the supplying pipe path.

8 Claims, 6 Drawing Sheets

SPHERICAL OBJECT SUPPLYING APPARATUS

BACKGROUND OF THE INVENTION

1. Field of the Invention

This invention relates to spherical object supplying apparatus, and more particularly to a spherical object supplying apparatus which is used for supplying spherical objects from a process to the following process in a process of treating or manufacturing spherical objects such as spherical single crystal silicon.

2. Description of the Related Art

Heretofore, a semiconductor device is formed according to the following method: That is, a circuit pattern is formed on a plate-shaped single crystal silicon wafer, and the wafer thus processed is subjected to dicing as required, to form a semiconductor chip. In this connection, recently a technique has been proposed in the art that a circuit pattern is formed on a spherical semiconductor (or ball semiconductor) less than 1 mm in diameter.

The formation of discrete elements such as solar batteries and photo-sensors or semiconductor integrated circuits, for instance, with spherical single crystal silicons, needs a variety of treatment processes such as a process of mirror-polishing spherical single crystal silicons, a washing process, a film forming process, a resist coating process, a photo-lithography process, and an etching process. And in order to manufacture the spherical semiconductor elements with high efficiency, it is necessary to provide a manufacturing line system including the aforementioned variety of processes.

If, with respect to the manufacturing line system, spherical single crystal silicons are irregularly delivered to a processing station (hereinafter referred to as " a second station", when applicable) from the preceding processing station (hereinafter referred to as " a first station", when applicable), then at the second station the amount of spherical single crystal silicons supplied thereto is variable, and therefore the processing conditions must be adjusted according to the variable amount of spherical single crystal silicons. Hence, in this case, it is impossible to achieve the processes with high efficiency. Hence, it is essential that spherical objects such as spherical single crystal silicons are sequentially and periodically conveyed to a processing station from the preceding processing station at predetermined intervals. The surfaces of a silicon is liable to be oxidized. If the surface of the silicon is covered with a natural oxide film, the silicon is not sufficiently in contact with a metal electrode layer formed on the natural oxide film. That is, it is preferable that the spherical objects are conveyed and treated in a closed space without contacting the outside air.

As above described, in order to manufacture spherical semiconductor elements with high efficiency, it is necessary to connect the various processing stations one after another; that is, to provide the processing stations in a line, and to sequentially supply the aforementioned spherical single crystal silicons to all of the processing stations. And, in view of productivity and quality, the aforementioned operations must be carried out at high speed and with high reliability.

Figure 1:
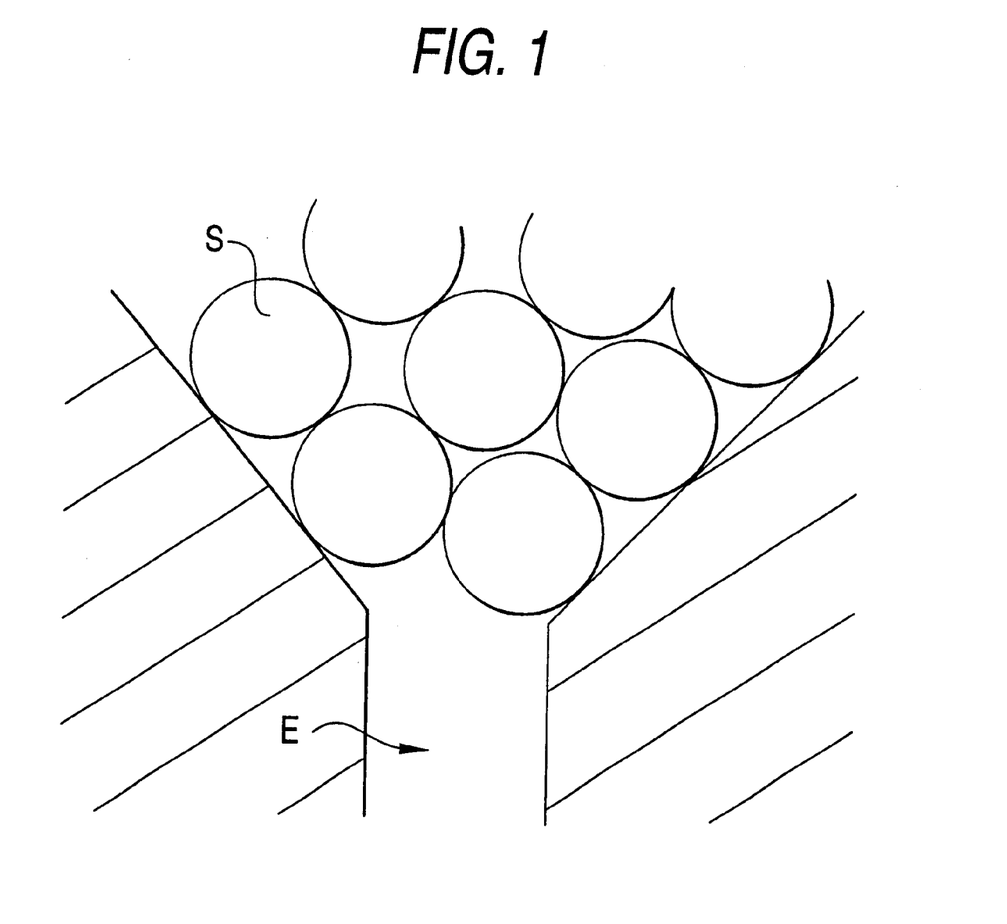
FIG. 1 is an enlarged sectional view showing the accumulation of spherical objects at the outlet of a storing container such as a hopper.

In the case where spherical objects stored in a storing container like a hopper is dropped one at a time through the pipe of the container so as to be supplied to a processing station, as shown in FIG. 1 the spherical objects S are gathered (stacked) at the outlet E as in the case of blocks stacked to form a block wall, thus closing the outlet E.

SUMMARY OF THE INVENTION

In view of the foregoing, an object of the invention is to provide a spherical object supplying apparatus which, in supplying spherical objects such as spherical single crystal silicons from a storing container such as a hopper to a processing or manufacturing station, positively and smoothly supplies the spherical objects thereto one at a time.

Another object of the invention is to provide a spherical object supplying apparatus which is simple in construction, and periodically and quickly supplies spherical objects such as spherical single crystal silicons at predetermined intervals.

A further object of the invention is to provide a spherical object supplying apparatus which quickly supplies spherical objects such as spherical single crystal silicons in a non-contact mode without damaging the surfaces of the spherical objects.

A First aspect of the apparatus is a spherical object supplying apparatus of the present invention, which comprises:

a supplying pipe-path coupled to a spherical object storing container;

a branch pipe path which branches from the supplying pipe path; and a fluid supplying apparatus adapted to introduce a pressurized fluid into the branch pipe path, spherical objects being conveyed by the pressurized fluid which is jetted through the branch pipe path into the supplying pipe path.

A second aspect of the apparatus is an apparatus according to the first aspect, wherein the branching angle of the branch pipe path with respect to the supplying pipe path is 45° or less.

A third aspect of the apparatus is an apparatus according to the first aspect, wherein the fluid supplying apparatus has a pressurized fluid introducing pipe whose open end is located in the storing container, to jet pressurized fluid into the storing container.

A fourth aspect of the apparatus is an apparatus according to the first aspect, wherein a part of the supplying pipe path which is located downstream of the branching point of the branch pipe path as viewed in the direction of conveyance of spherical objects is bent and extended along the prolongation of the branch pipe path.

A fifth aspect of the apparatus is an apparatus according to the first aspect, wherein the supplying pipe path is made up of a plurality of small supplying pipe paths which are connected in series to one another, and arranged in such a manner that diameters thereof are gradually smaller in the direction of conveyance of spherical objects.

A sixth aspect of the apparatus is an apparatus according to the fifth aspect, wherein the small supplying pipe paths have branch pipe paths, respectively.

A seventh aspect of the apparatus is an apparatus according to the first aspect, wherein the spherical objects are spherical silicons.

An eighth aspect of the apparatus is an apparatus according to the seventh aspect, wherein the pressurized fluid is an inert gas.

A first specific aspect of the invention resides in that, when spherical objects are supplied through the supplying pipe path thus as a pipe, the pressurized fluid is introduced into the supplying pipe path to accelerate the spherical objects thereby to quickly and positively the spherical objects to the following processing apparatus (or station).

That is, the spherical objects are supplied the following processing apparatus (or station) while being accelerated by the pressurized fluid jetted at high speed. This fact eliminates the difficulty that the spherical object supplying rate is lower than the spherical object processing rate. And, by adjusting the flow rate and pressure of the pressurized fluid, the spherical object supplying speed can be freely controlled.

A second specific aspect of the invention resides in that the angle of introduction of the pressurized fluid which is introduced into the supplying pipe path is set to 45° or less. The limitation of the branch angle θ to 45° or less prevents the pressurized fluid from flowing backwardly, upwardly as viewed in the direction of conveyance of spherical objects. Hence, in addition to the above-described effect, the invention has an effect that the spherical objects are stably conveyed.

A third specific aspect of the invention resides in that the open end of the pressurized fluid introducing pipe is located in the storing container to jet pressurized fluid into the storing container thereby to agitate the spherical objects in the storing container.

The agitation of the spherical objects in the storing container with the pressurized fluid prevents the outlet of the storing container with the spherical objects. Hence, in addition to the above-described effects, the invention has an effect that the spherical objects can be supplied into the supplying pipe path positively one at a time.

A fourth specific aspect of the invention resides in that the supplying pipe path is bent and extended in the direction of the branch pipe path, so that the spherical objects are conveyed with the direction maintain unchanged in which the spherical object accelerating pressurized fluid is jetted.

In the apparatus of the fourth aspect, it is unnecessary to change the flow path of the high-speed accelerating fluid which is jetted from the branch pipe path into the supplying pipe path. Accordingly, in addition to the above-described effects, the invention has an effect that the spherical objects are accelerated with high efficiency so as to be supplied to the following processing apparatus (or station).

A fifth specific aspect of the invention resides in that the supplying pipe path is made up of a plurality of small supplying pipe paths which are connected in series to one another, and arranged in such a manner that diameters thereof are gradually smaller in the direction of conveyance of spherical objects, so that the spherical objects are supplied smoothly one at a time.

In the invention of the fifth aspect, the high-speed accelerating fluid jetted from the branch pipe path is provided in the form of a laminar flow, thus arranging the spherical objects in a line. Hence, in addition to the above-described effects, the invention has an effect that the spherical objects are supplied to the following processing apparatus (or station) positively one at a time.

A sixth specific aspect of the invention resides in that the small supplying pipe paths have the branch pipe paths, respectively. Hence, the spherical objects can be accelerated plural times; that is, they can be conveyed at high speed.

A seventh specific aspect of the invention resides in that the spherical objects are spherical silicons such as single crystal silicons. The spherical objects are conveyed efficiently without being scratch-by friction or contaminated.

An eighth specific aspect of the invention resides in that the pressurized fluid is an inert gas. Hence, for instance when circuit-forming single crystal silicons are conveyed, no natural oxide film is formed thereon. That is, the spherical objects are conveyed with high efficiency.

The nature, utility and principle of the invention will be more clearly understood from the following detailed description and the appended claims when read in conjunction with the accompanying drawings.

DESCRIPTION OF THE PREFERRED EMBODIMENTS

Preferred embodiments of the invention will be described with reference to the accompanying drawings; however, the invention is not limited thereto or thereby.

First Embodiment

An example of a spherical object supplying apparatus, which constitutes a first embodiment, will be described with reference to FIG. 2, a sectional diagram.

Figure 2:
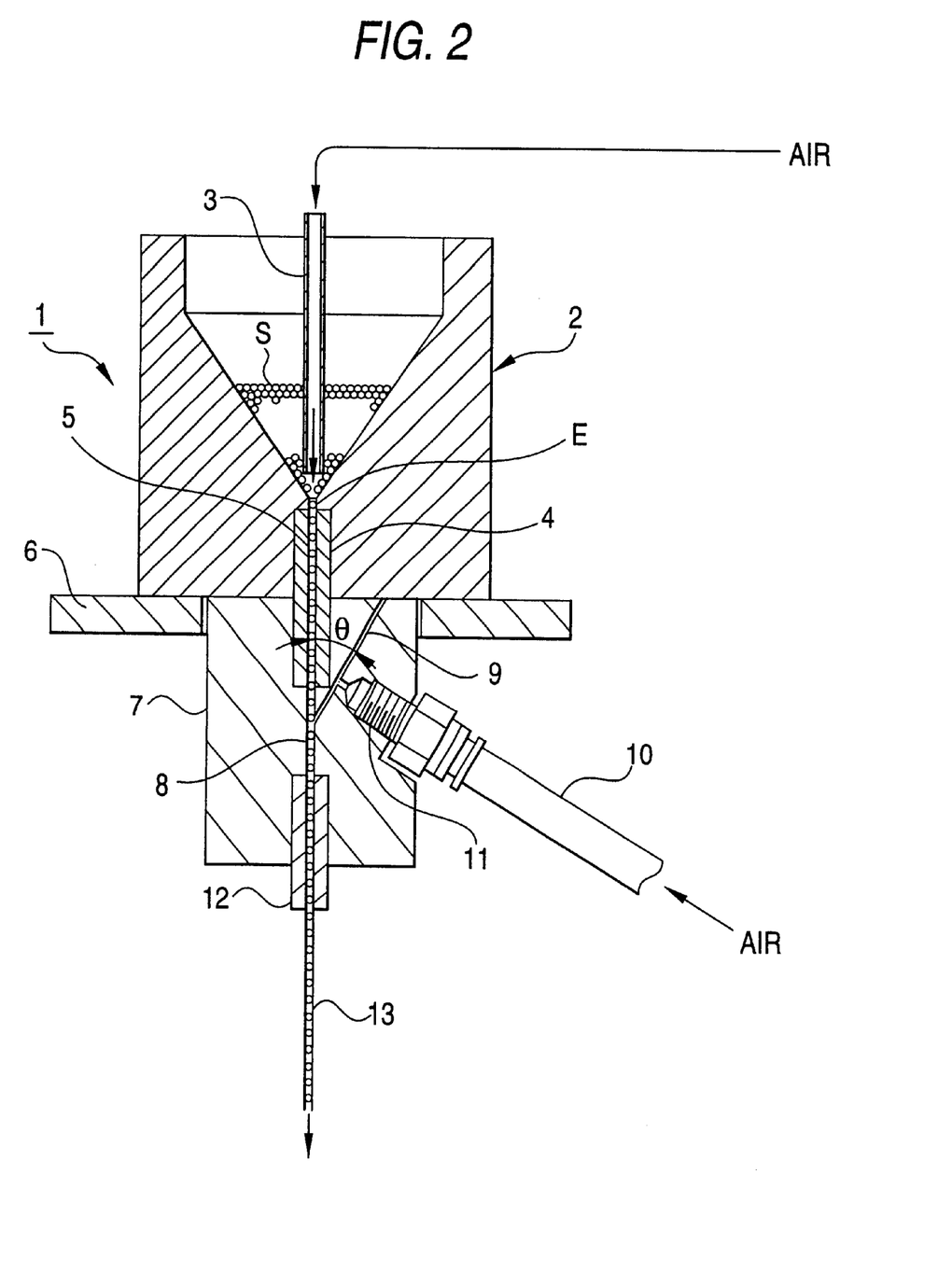
FIG. 2 is a sectional view showing an example of a spherical object supplying apparatus, which constitutes a first embodiment of the invention.
Figure 3:
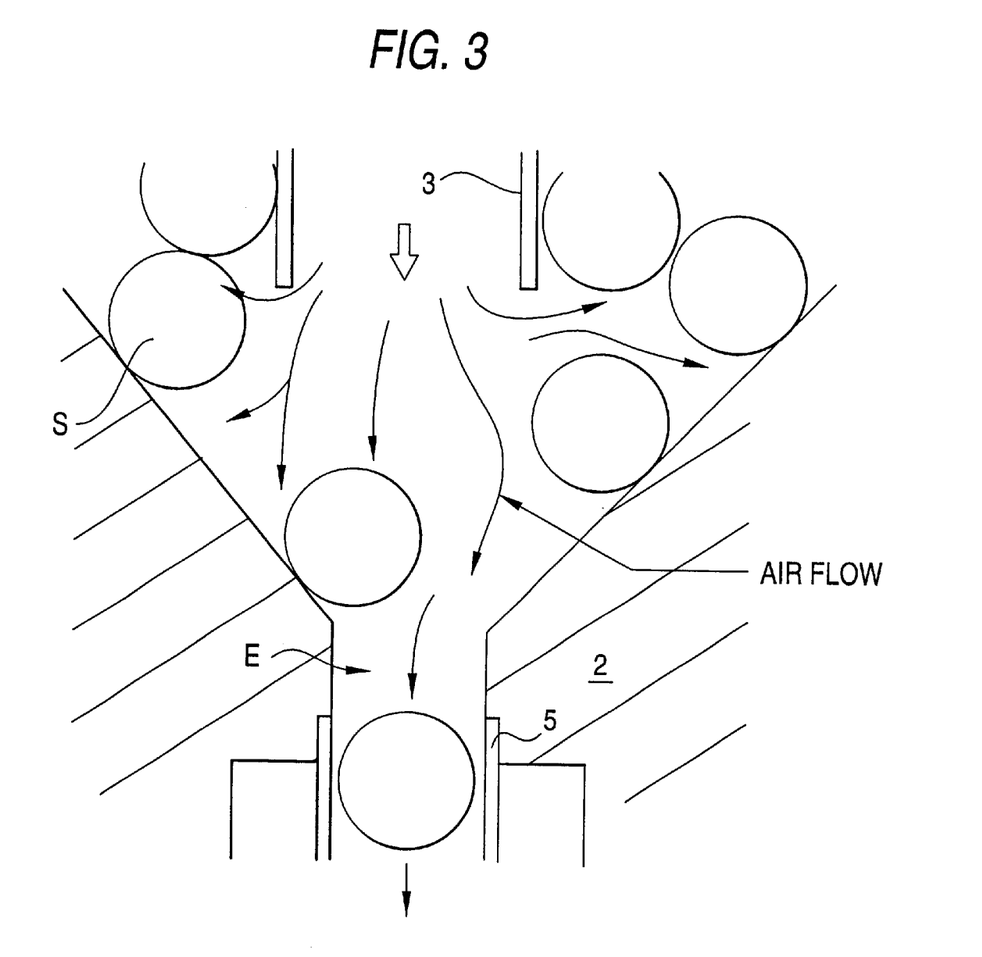
FIG. 3 is an enlarged section view showing the state of spherical objects at the outlet of the storing container such as a hopper in the spherical object supplying apparatus, the first embodiment of the invention.

In FIG. 2, reference numeral 1 designates the spherical object supplying apparatus, the first embodiment, which includes a storing container, namely, a hopper 2. A closure preventing air introducing pipe 3 is arranged in the storing space which is the inside of the hopper 2. One end of the pipe 3 is connected to an air supplying apparatus, and the other is opened at the outlet E formed at the conical top of the hopper 2. The position of arrangement of the open end of the air introducing pipe 3 is not particularly limited as far as the open end of the air introducing pipe 3 prevents the closure of the outlet E. However, in order that the stream of the closure preventing air jetted from the air introducing pipe 3 is allowed to reach the deep of the outlet E, and that spherical objects are effectively and uniformly agitated with the aforementioned air, it is preferable that, as shown in FIG. 3, the central axis of the air introducing pipe 3 is the same as the central axis of the outlet E, and the open end of the piper 3 is at a predetermined distance from the outlet E. In this connection, the diameter of the air introducing pipe 3, the flow rate and the pressure of the air thus jetted are so determined with respect to the position of the open end that the outlet E may not closed with spherical objects S.

As shown in FIG. 2, a joint 4 is provided below the outlet E of the hopper, and the outlet E is coupled to a joint tube 5 in the joint. The joint tube 5 may be made of a variety of materials such as resin and metal, and the joint tube thus made may be coated with fluoro-resin.

The hopper 2 is coupled through a hopper plate 6 to a vacuum holder 7. As shown in FIG. 2, a spherical object (S) accelerating pipe path 8 and a branch pipe path 9 are formed in the vacuum holder 7. The upper end of the accelerating pipe path 8 is connected to the joint tube 5.

As shown in FIG. 2, the branch pipe path 9 branches from a predetermined part of the accelerating pipe path 8. In this connection, the branch angle θ is not particularly limited as far as an accelerating air supplied into the branch pipe path 9 through an air supplying nozzle 11 (described later) sufficiently accelerates the spherical objects S; however, the branch angle θ is preferably 45° or less, and more preferably 30° or less in view of the acceleration efficiency thereof. If the branch angle ζ is larger than 45°, then the aforementioned air flows backwards into the joint tube 5, thus obstructing the movements of the spherical objects S.

The branch pipe path 9 is connected to the air supplying nozzle 11. The position of connection of the air supplying nozzle 11 is not particularly limited; however, in order to minimize the pressure loss of the pressurizing air which is supplied through the nozzle 11, it is preferable that, as shown in FIG. 2, the nozzle 11 is connected to the branch pipe path 9 near the branching point of the accelerating pipe path 8.

The air supplying nozzle 11 is connected to the end of an air supplying tube 10 which is extended from an air supplying apparatus (not shown), thus jetting a spherical object (S) accelerating air into the branch pipe path 9. The accelerating air jetted into the branch pipe path 9 is jetted into the accelerating pipe path 8 through the aforementioned branching point, thus conveying spherical objects S while accelerating them which have been moved into the accelerating pipe path 8 from the joint tube 5.

The aforementioned air supplying apparatus adapted to supply an accelerating air may be one which is separated from the aforementioned air supplying apparatus adapted to supplying a closure preventing air, or may be integral with the latter.

The lower portion of the vacuum holder 7 is coupled to an adapter 12 in which a spherical object (S) conveying tube 13 is arranged. One end of the tube 13 is connected to the accelerating pipe path 8 in the vacuum holder 7, and the other end is coupled to the following processing apparatus (station) not shown. The material of the conveying tube 13 may be the same as that of the joint tube 5.

In the embodiment, the joint tube 5, the accelerating pipe path 8, and the conveying tube 13 are coupled to one another in a straight line, thus forming a spherical object (S) supplying pipe path. Accordingly, the spherical objects S are supplied to the following processing apparatus (station) not shown without changing the direction of conveyance.

The operation of the spherical object supplying apparatus 1 thus designed will be described.

A number of spherical objects S about 1 mm in diameter are stored in the hopper 2, and are collected around the outlet E by their own weights. However, since the closure preventing air introducing pipe 3 is vertically held in the hopper as shown in FIG. 2, gaps are provided around the open end thereof as shown in FIG. 3.

When, under this condition, the closure preventing air supplied from the air supplying apparatus (not shown) is jetted through the closure preventing-air introducing pipe 3 from the open end thereof, as shown in FIG. 3 the stream of the air agitates the spherical objects S accumulated near the outlet E of the hopper, and pushes the spherical objects-S towards the outlet E, thus sending them into the joint tube 5.

Hence, the outlet E of the hopper 2 will never be clogged up with the spherical objects S, and the latter S are sent out of the hopper 2 one at a time by their own weight and by the air. The flow rate of the closure preventing air is so adjusted that the spherical objects S are not excessively agitated; that is, the movement of the spherical objects S towards the outlet E is not obstructed by the excessive agitation thereof.

Each of the spherical objects S sent out of the hopper 2 is delivered through a joint tube 5 to the accelerating pipe path 8.

Into the accelerating pipe path 8, the accelerating air is jetted from the branch pipe path 9 in the direction of conveyance of spherical objects S. The accelerating air is supplied from the air supplying apparatus (not shown). More specifically, the accelerating air is introduced into the branch pipe path 9 through the air supplying nozzle 11, and its flow rate and pressure are adjusted freely.

By the action of the accelerating air, the inside of the accelerating pipe path 8 which is above the branching point of the branch pipe path 9 is negative in pressure, so that the spherical objects S are sucked. Accordingly, the spherical objects S are moved downwardly-in the accelerating pipe path 8 by their own weights and by the action of suction of the aforementioned accelerating air. When each of the spherical objects S reaches the branching point (in the accelerating pipe path 8) of the branch pipe path 9, it is accelerated by the accelerating air, thus being moved into the conveying tube 13.

In supplying spherical objects with the spherical object supplying apparatus of the invention, the spherical objects S are supplied to the following processing station while being accelerated by the air which is jetted at high speed. Hence, the apparatus of the invention is free from the difficulty that the spherical object supplying rate is slower than the spherical object processing speed at the following processing station. In addition, the spherical object supplying rate can be freely controlled by adjusting the flow rate and pressure of the jetting air. Furthermore, in the apparatus of the invention, the air is jetted into the storing container, too, so that the spherical objects are supplied while being agitated. Therefore, the apparatus of the invention is free from the difficulty that the outlet of the storing container is clogged with the spherical objects, so that the latter are supplied irregularly.

In the above-described embodiment, spherical objects S are supplied from the hopper 2 through the supplying pipe path to the following processing apparatus (not shown) without changing the direction of conveyance thereof. Hence, the decrease in supply speed of the spherical objects S is minimized. Furthermore, the frequency is low at which the spherical objects S are brought into contact with the inner cylindrical surface of the aforementioned supplying pipe path, and therefore the spherical objects S are supplied-to the following processing station without damaging their surfaces.

Second Embodiment

Another example of the spherical object supplying apparatus, which constitutes a second embodiment of the invention, will be described with reference to FIG. 4 in which parts corresponding functionally to those already described with reference to FIG. 2 are therefore designated by the same reference numerals or characters.

In FIG. 2, reference character 1' designates the spherical object supplying apparatus, the second embodiment; and 12', an adapter having a nozzle 12'a at the end. As shown in FIG. 4, the adapter 12' is provided between a second hopper 14 and the vacuum holder 7, The second hopper 14 is coupled to the conveying tube 13. Further in FIG. 4, reference numeral 15 designates a spherical object supplementing funnel.

In the second embodiment, the joint tube 5, the accelerating pipe path 8, the adapter 12', and the conveying tube 13 form a spherical object (S) supplying tube path; however, it should be noted that a part of the spherical object (S) supplying tube path is extended on the prolongation of the branch pipe path 9 in the vacuum holder 7. That is, similarly as in the case of FIG. 2, the branch pipe path 9 branches from the accelerating pipe path 8 in such a manner that the former 9 forms an angle θ' with the latter 8; and as shown in FIG. 4 the part of the accelerating pipe path 8 which is extended downwardly from the branching point of the branch pipe path 9 is formed-in the vacuum holder 7 in such a manner that it is bent along the prolongation of the branch pipe path 9. The aforementioned angle θ' may be suitably changed so that the direction of conveyance of spherical objects S is smoothly changed; however, preferably it is in a range of from 5° to 45°, and more preferably it is in a range of from 10° to 20°.

The spherical object supplying apparatus thus constructed, the second embodiment, will be described, operates as follows:

Similarly as in the case of the apparatus shown in FIG. 2, the first embodiment, the spherical objects S conveyed in the accelerating pipe path 8 are accelerated by the accelerating air jetted from the branch pipe path 9. During this operation, the direction of movement of the spherical objects S is changed. The spherical objects whose direction of movement has been changed, after passing through the adapter 12', are introduced through the nozzle 12'a of the adapter 12' into the conveying tube 13.

In the second embodiment, it is unnecessary to change the flow path of the high-speed accelerating air jetted from the branch pipe path 9, and therefore the spherical objects are accelerated with high efficiency so as to be supplied to the following processing station (apparatus).

Figure 4:
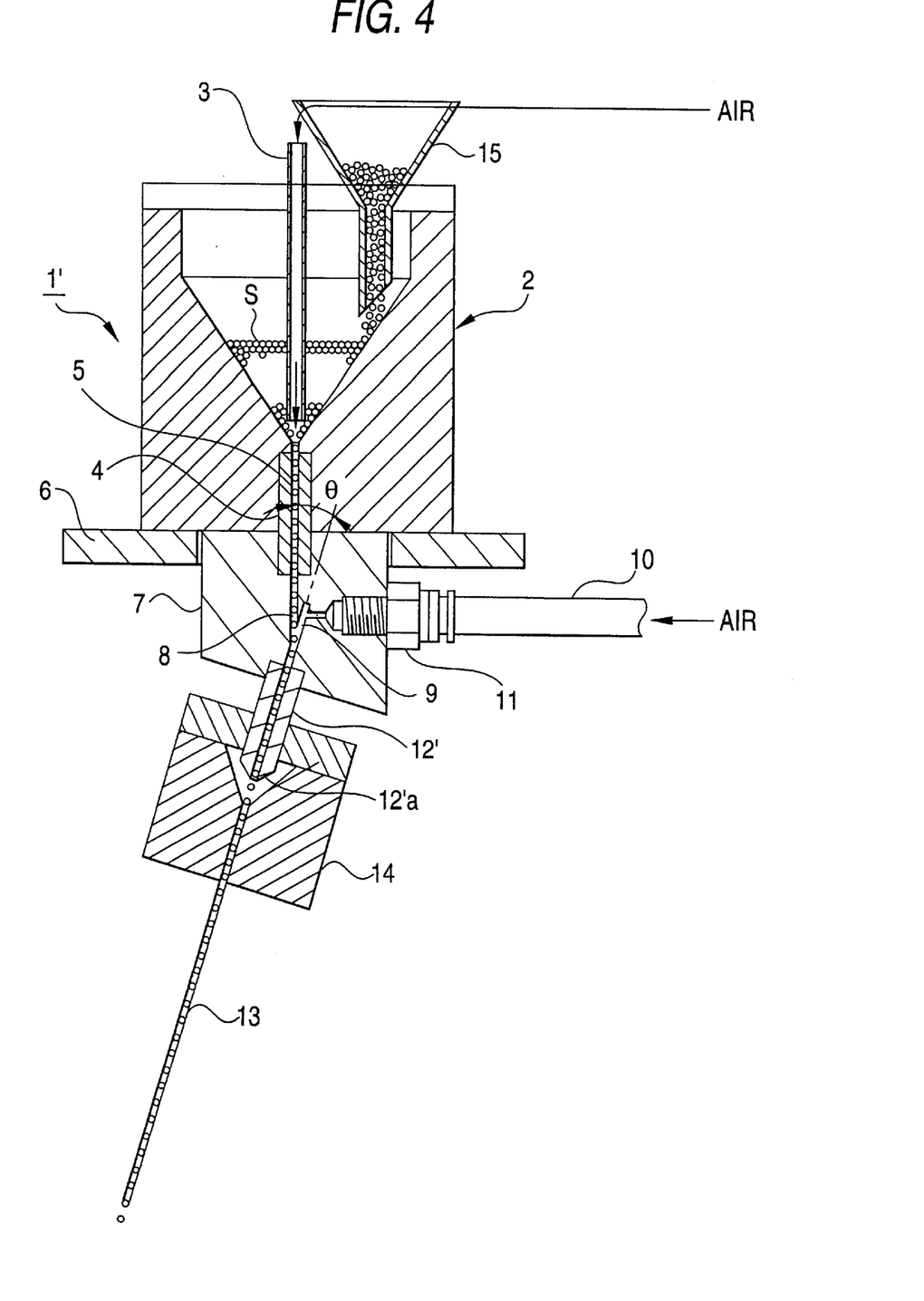
FIG. 4 is a sectional view showing another example of the spherical object supplying apparatus, which constitutes a second embodiment of the invention.

If, in the apparatus shown in FIG. 4, the spherical objects can be smoothly supplied, then the conveying tube 13 may be directly connected to the adapter 12 without the use of the second hopper 12.

The aforementioned spherical object supplementing funnel 15 is used to supplement spherical objects S when the latter becomes short in number. Hence, it may be provided for the apparatus shown in FIG. 2 (the first embodiment).

Third Embodiment

Another example of the spherical object supplying apparatus, which constitutes a third embodiment of the invention, will be described with reference to FIG. 5, in which parts corresponding functionally to those already described with reference to FIGS. 2 and 4 (the first and second embodiment) are therefore designated by the same reference numerals or characters.

Figure 5:
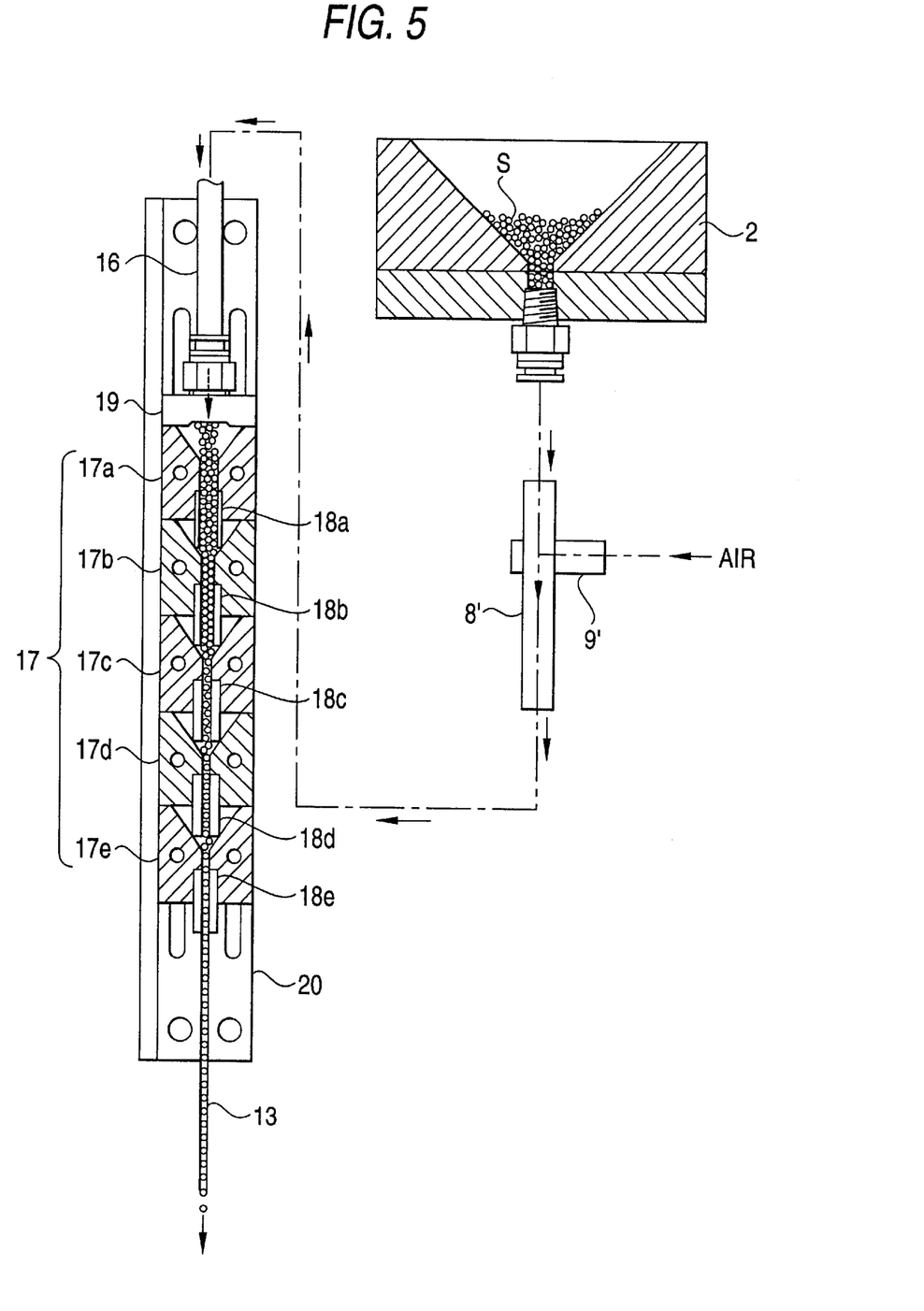
FIG. 5 is a sectional view showing another example of the spherical object supplying apparatus, which constitutes a third embodiment of the invention.
Figure 6:
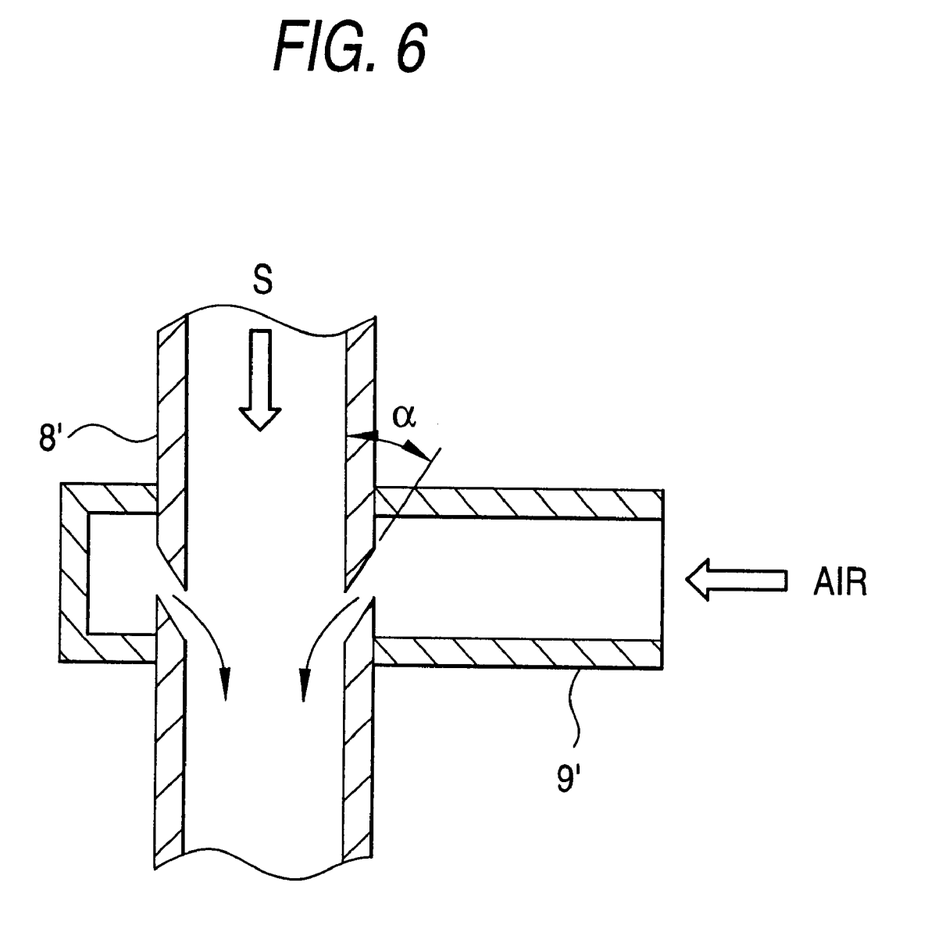
FIG. 6 is a sectional view showing a branch pipe path and an accelerating pipe path in the spherical object supplying apparatus, the third embodiment of the invention.

In FIG. 5, reference character 8' designates an accelerating pipe path; and 9', a branch pipe path. Similarly as in the cases of the first and second embodiments (FIGS. 2 and 4), an accelerating air is jetted from the branch pipe path 9'towards the accelerating pipe path 8'. More specifically, as shown in FIG. 6, a number of through-holes are formed in the cylindrical wall of the accelerating pipe path 8' in such a manner that they are extended from the outer cylindrical surface thereof to the inner cylindrical surface obliquely in the direction of conveyance of spherical objects S, forming an angle α. Similarly as in the case of the above-described branch angle θ, the angle α is not particularly limited as far as the accelerating air jetted into the accelerating pipe path 8' sufficiently accelerates the spherical objects S; however, preferably it is 45° or less; more preferably 30° or less. If the angle α is larger than 45°, then the aforementioned air flows backwardly in the accelerating pipe path 8', thus obstructing the movement of the spherical objects S.

Further in FIG. 5, reference numeral 16 designates a tube relatively large in diameter which is adapted to introduce a plurality of spherical objects S into an arranging hopper assembly 17 (described later) which are supplied from the hopper 2 through a pipe path (not shown)

The arranging hopper assembly 17 is designed as follows: A plurality of small hoppers 17 a through 17 e, which are different in outlet diameter, are connected to one another through coupling pipes 18 a through 18 e in such a manner that the outlet diameter are gradually smaller in the direction of conveyance of spherical objects S. The arranging hopper assembly 17 is held between a hopper cover 19 and a hopper holder 20.

That is, in the embodiment, the spherical object flow path in the arranging hopper assembly 17 and the coupling pipes 18 a through 18 e form a part of the spherical object supplying pipe path.

The operation of the spherical object supplying apparatus, the third embodiment of the invention, will be described.

In the embodiment, by the action of the accelerating air jetted from the branch pipe path 9', a plurality of spherical objects S are supplied from the hopper 2 all at once, and introduced through the tube 16 into the arranging hopper assembly 17. In the arranging hopper assembly 17,-the diameter of the pipe path through which the spherical objects are conveyed are gradually smaller downwardly (towards the hopper holder). Hence, the high-speed air stream is formed into a laminar flow, so that the spherical objects S are gradually arranged, and finally arranged in a line, thus being supplied into the conveying tube 13.

With the apparatus, a number of spherical objects can be treated all at once, and finally the spherical objects S can be conveyed smoothly one at a time. Since the outlet of the hopper 2 may be large in diameter, the difficulty is eliminated that the outlet of the hopper 2 is clogged with the spherical objects S.

In the third embodiment, too, the hopper 2 may have the spherical object supplementing funnel 15 as shown in FIG. 4.

In the above-described embodiments, the accelerating gas jetted from the branch pipe path into the hopper 2 and the accelerating pipe path 8 is air; however, inert gas such as argon and nitrogen may be employed. As was described before, the surfaces of a silicon is liable to be oxidized. If the surface of the silicon is covered with a natural oxide film, the silicon is not sufficiently in contact with a metal electrode layer formed on the natural oxide film. However, this difficulty is eliminated by the employment of inert gas as the accelerating gas.

Furthermore, it is preferable to add a small quantity of reducing gas such as hydrogen gas to the inert gas supplied into the hopper. In this case, an additional effect is obtained that the oxidized silicon surface is reduced.

In addition, when the pressurized gas is supplied from the branch pipe path, it is preferable that the pressurizing gas thus supplied is in the form of a tornado stream. In this case, the spherical objects can be conveyed without contacting the conveying path.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A substantially spherical object supplying apparatus which comprises:
   a supply pipe which defines a supply path, said supply path comprising an outlet of a substantially spherical object storing container;
   a branch pipe, said branch pipe defining a path which branches from said supply pipe path; and
   a fluid supply apparatus adapted to introduce a pressurized fluid into said branch pipe path intermediate the ends of said branch pipe,
   wherein substantially spherical objects in said supply pipe are conveyed by said pressurized fluid which is injected through said branch pipe path into said supply pipe path.

2. The substantially spherical object supplying apparatus as claimed in claim 1, in which a branching angle of said branch pipe path with respect to said supply pipe path is 45° or less.

3. The substantially spherical object supplying apparatus as claimed in claim 1, in which said substantially spherical objects are substantially spherical silicon.

4. The substantially spherical object supplying apparatus as claimed in claim 3, in which said pressurized fluid is an inert gas.

5. The substantially spherical object supplying apparatus as claimed in claim 1, said supply pipe having an inner diameter sized to receive substantially spherical objects from said storing container in a single file fashion.

6. The substantially spherical object supplying apparatus as claimed in claim 1, further comprising a second fluid supplying apparatus, a conduit connected to said second fluid supplying apparatus, a free end of said conduit positioned within said storing container and injecting a fluid into said storing container.

7. The substantially spherical object supplying apparatus as claimed in claim 1, said substantially spherical objects comprising single crystal silicones.

8. The substantially spherical supplying apparatus as claimed in claim 1, said substantially spherical objects are uniformly supplied.

* * * * *